United States Patent
Volpe

(10) Patent No.: US 8,633,760 B2
(45) Date of Patent: Jan. 21, 2014

(54) OP-R, A SOLID STATE FILTER

(71) Applicant: Rafaela Volpe, Stamford, CT (US)

(72) Inventor: Gerald T. Volpe, Stamford, CT (US)

( * ) Notice: Subject to any disclaimer, the term of this patent is extended or adjusted under 35 U.S.C. 154(b) by 0 days.

(21) Appl. No.: 13/706,053

(22) Filed: Dec. 5, 2012

(65) Prior Publication Data

US 2013/0093507 A1   Apr. 18, 2013

Related U.S. Application Data

(63) Continuation of application No. 12/653,982, filed on Dec. 22, 2009, now Pat. No. 8,354,880.

(60) Provisional application No. 61/274,173, filed on Aug. 13, 2009.

(51) Int. Cl.
*H03K 5/00* (2006.01)

(52) U.S. Cl.
USPC .......................................... 327/559; 327/552

(58) Field of Classification Search
USPC .................. 327/551–553, 558, 559
See application file for complete search history.

(56) References Cited

U.S. PATENT DOCUMENTS

| | | | |
|---|---|---|---|
| 3,638,037 A | 1/1972 | McMurtrie | |
| 3,786,363 A * | 1/1974 | Lelie | 330/302 |
| 4,158,818 A | 6/1979 | Lerner | |
| 5,296,822 A | 3/1994 | Cockey, IV | |
| 5,686,861 A * | 11/1997 | Shou et al. | 327/552 |
| 6,710,644 B2 * | 3/2004 | Duncan et al. | 327/558 |
| 6,753,725 B2 | 6/2004 | Grundy | |
| 6,854,005 B2 * | 2/2005 | Thiele | 708/819 |
| 7,081,788 B2 | 7/2006 | Hagari | |
| 7,750,730 B2 | 7/2010 | Irino | |
| 7,843,258 B2 | 11/2010 | Ishiguro | |
| 8,135,340 B2 * | 3/2012 | Rofougaran et al. | 455/39 |
| 8,354,880 B2 * | 1/2013 | Volpe | 327/557 |

\* cited by examiner

*Primary Examiner* — Hai L Nguyen

(74) *Attorney, Agent, or Firm* — St. Onge Steward Johnston & Reens LLC

(57) ABSTRACT

The device described herein proposes an electronic active filter void of capacitors and inductors. The circuit utilizes only operational amplifiers (OP-Amp) and resistors, hence the name Op-R. Although capable of being constructed of lumped circuit elements this filter is intended for integrated circuit (IC) applications. Filtering of signals can be accommodated from dc through the UHF frequency range depending on the selected op-amp ICs. Low pass, band pass, high pass, as well as band reject frequency responses are achievable. Although the circuits described herein are single input-single output, multiple inputs and outputs present no difficulty, being limited only chip space. Temperature and production spread variations are also considered within the realm of tenability.

6 Claims, 6 Drawing Sheets

OP-R, A SOLID STATE FILTER

FIELD OF THE INVENTION

The invention is directed toward electrical filters, and in particular to low power applications encountered in, for example, the fields of signal processing, communications, and noise reduction. The invention is directly applicable, but not limited to, integrated circuits.

BACKGROUND OF THE INVENTION

Classically, electrical filters were constructed of lumped circuit passive elements. The elements included were resistors, inductors or coils, and capacitors, usually non-polarized. As electrical engineering evolved it became necessary to reduce the size and weight of these elements. Since the inductor represented the largest volume component there was motivation to remove it. It was later discovered that an amplifier with resistance-capacitance could replace the inductor to get the same effect.

The new method was termed active RC filter design. Although active RC filters could emulate passive filters they required a power supply. Also active RC filter by nature could not handle large power transients. Still the active RC filter presented a small footprint at low cost and had the inherent advantages of signal gain and impedance isolation of load and source.

As the computer age entered solid-state amplifiers became even smaller at even lower power and cost. Now the capacitor element became the size limitation. Although capacitors exist in ICs their needed circuit values were not forthcoming. This was such a problem that digital filters began to emerge. But the need for analog filters remained owing to requirements of pre-aliasing and post smoothing in conjunction with digital filter use.

The demand for higher bandwidth continues to limit the use of digital filters for many applications in the video frequency and UHF frequency ranges. Meanwhile the development of extremely high gain-bandwidth operational amplifiers (Op Amps) continues making active RC quite attractive even with the capacitor element requirement.

It therefore seemed reasonable to search for a filter design method that would employ op-amps with resistor feedback.

SUMMARY OF THE INVENTION

Active RC filters are the most important class of filters in present day analog design. Their popularity stems from the convenient availability of operational amplifiers and the use of feedback lack to replace the inductor component L. Still the capacitor must be physically realized which presents difficulty in achieving practical values on a monolithic chip. The point of this effort is to utilize the op-amp and its internal capacitor $C_c$ as a replacement for L and C components to achieve filtering. We call the specific method defined herein Op-R (Op-amp with resistance R only) filter design.

In classic active RC design the op-amp is chosen with sufficiently high gain-bandwidth through the filter's pass and transition bands. In this way the amplifier's phase shift does not enhance a filter stage's Q factor beyond the design limit (Q enhancement). The op-amp's gain-bandwidth is determined by its internal transistor cut-off frequencies but mainly limited by its internal compensation capacitor $C_c$. The compensation capacitor $C_c$ is required with negative feedback applied due to excess phase shift from the stages of amplification. Otherwise, the amplifier oscillates. Thus, the compensation capacitor $C_c$ is needed to make the op-amp work but compromises gain-bandwidth. In this way no external storage compensation elements are required. The specific method used does not compromise gain-bandwidth because it uses all of the devices' internal amplification potential in the filtering process. This advantage enables the design of wideband filters in the audio, video, and even UHF frequency ranges.

Another advantage of Op-R filters is that besides achieving filtering in a classic second order section-by-section approach, the Op-R method can also be extended to passive filter design. Since passive RLC filters enjoy low sensitivity compared to their active RC counterpart Op-R can likewise realize low sensitivity. Thus, with no L and C components required integrated circuit manufacturing is possible leading to compact reliable design.

A price to be paid for the Op-R technique is the variation of gain-bandwidth over production spread, as well as strong dependency on the amplifier's gain-bandwidth on temperature. Resistor trimming in current mirror circuits deals with the former problem. As to the latter problem, it will be shown that thermal compensation can be used in conjunction with current mirroring to stabilize the filter's performance with temperature.

DRAWINGS

Reference Numerals

01 Op-Amp (Operational Amplifier) A1
02 Resistor R2
03 Inductor L3
04 Resistor R4
05 Voltage Source V5
06 Branch Current I6
07 Node Voltage V7
08 Op-Amp A8
09 Resistor R9
10 Resistor R10

11 Capacitor C11
12 Voltage Source V12
13 Branch Current I13
14 Node Voltage V14
15 Voltage Source V15
16 Op-Amp A16
17 Resistor 17
18 Resistor 18
19 Inductor 19
20 Output Node Voltage V20
21 Capacitor C21
22 Resistor R22
23 Resistor R23
24 Output Node Voltage V24
25 Op-Amp A25
26 Voltage Source V26
27 Resistor R27
28 Resistor R28
29 Inductor L29
30 Capacitor C30
31 Output Node Voltage V31
32 Voltage Source V32
33 Resistor R33
34 Inductor L34
35 Capacitor C35
36 Resistor R36
37 Resistor R37
38 Output Node Voltage V38
39 Voltage Source V39
40 Resistor R40
41 OTA $g_1$ (Operational Transconductance Amplifier)
42 OTA $g_2$ (Operational Transconductance Amplifier)
43 OTA $g_3$ (Operational Transconductance Amplifier)
44 OTA $g_4$ (Operational Transconductance Amplifier)
45 Impedance Z
46 Output Node Voltage $V_2$
47 Impedance $R_L$
48 OTA Equivalent Block
49 Transconductance Controlled Source
50 Ideal Transformer Block
51 Series Impedance Block
52 Load Impedance Block
53 Resistor R53
54 Capacitor C54
55 Resistor R55
56 Resistor R56
57 Resistor R57
58 Resistor R58
59 Voltage Source V59
60 Op-Amp 60
61 Op-Amp 61
62 Op-Amp 62
63 Output Node Voltage 63

DETAILED DESCRIPTION OF THE INVENTION

The present invention relates to a solid-state filter realized on a monolithic integrated circuit (IC). The IC is capable of physically realizing a broad class of filters over a wide frequency range. The filter class includes low pass, high pass, band pass, and band reject. The frequency range is either: audio, sub-audio, radio, video or HF, as well as UHF.

An object of the invention is to physically realize filters without the need of inductors or capacitors, and instead, utilizes operational amplifiers (op-amps) and resistors; hence the name OP-R.

Basic Elements

Figure 1:
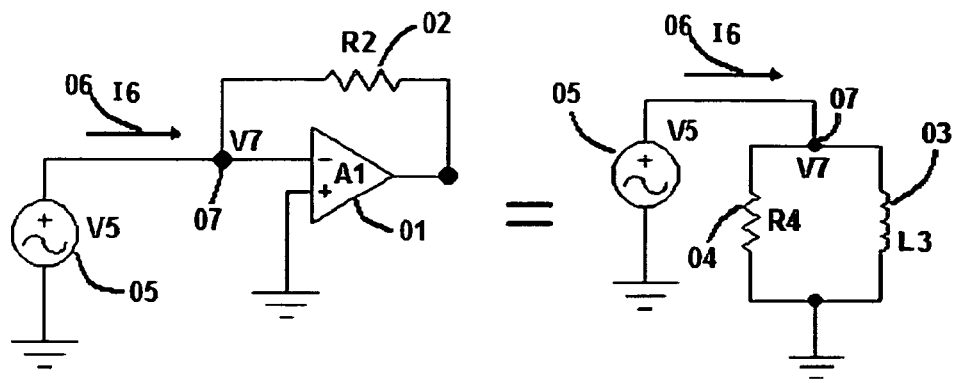
FIG. 1 Illustrates the equivalence of an op-amp with an associated feedback resistor to a lossy inductor.

Starting with the inductance element, FIG. 1 shows the equivalence of an OP-AMP 1 (A1) and an associated feedback RESISTOR 2 (R2) to a lossy inductor composed of INDUCTOR 3 (L3) and its associated parallel RESISTOR 4 (R4). Both equivalent circuits are driven by the same VOLTAGE SOURCE 5 (V5). Each circuit draws CURRENT 6 (I6) and has a responding VOLTAGE 7 (V7). The equivalence of the two circuits is given in terms of the input impedance, seen by VOLTAGE SOURCE V5, and described in FIG. 1. In the equivalence, the op-amp gain-bandwidth $\omega_t$ emerges as the main control of the filter inductor L3, which from FIG. 1 is defined by:

$$L3 = \frac{R2}{\omega_t} \quad \text{[Equation (1)]}$$

Figure 2:
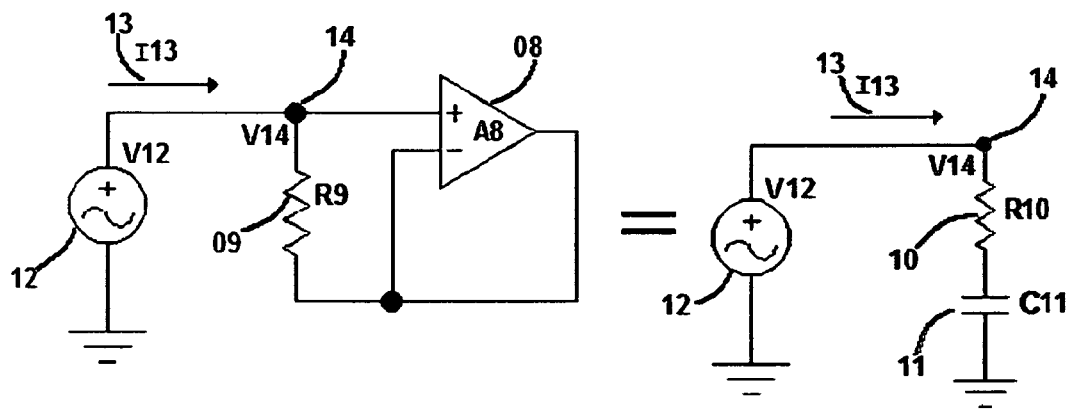
FIG. 2 Illustrates the equivalence of an op-amp with an associated feedback resistor to a lossy capacitor.

Next the capacitance element equivalence is shown in FIG. 2. Here OP-AMP 8 (A8) and RESISTOR 9 (R9) are equivalent to the CAPACITANCE 11 (C11) and its associated series RESISTOR 10 (R10). Again, both circuits are driven by voltage source VOLTAGE SOURCE 12 (V12) and respond with CURRENT 13 (I13) resulting in VOLTAGE 14 (V14). Again the op-amp gain-bandwidth $\omega_t$ controls the capacitor C11 in FIG. 2 defined by:

$$C11 = \frac{1}{R9\omega_t} \quad \text{[Equation (2)]}$$

Figure 3:
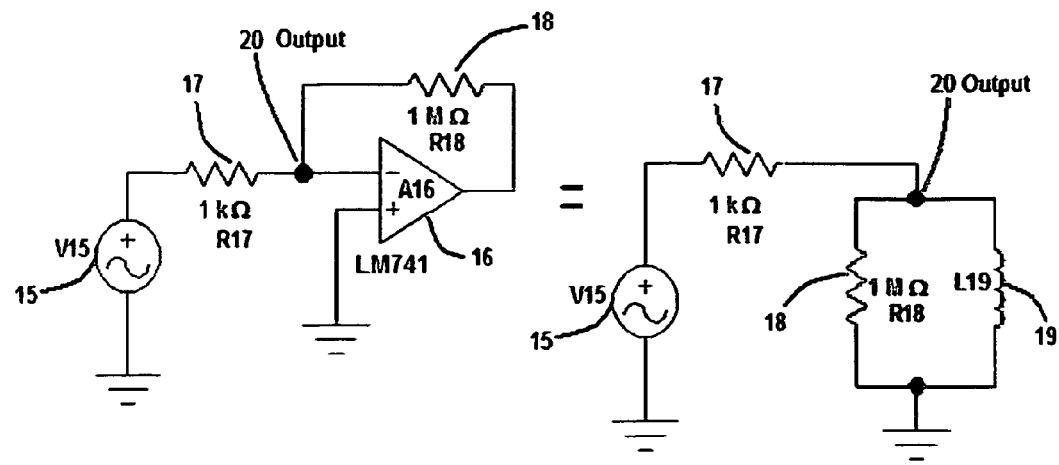
FIG. 3 Illustrates equivalence between op-amp with associated resistors and a passive high pass prototype.

With both inductance and capacitor parameters established, fundamental first order low pass and high pass filters can be realized. FIG. 3 shows high pass filter equivalence between OP-R (left) and the passive high pass prototype (right). In the OP-R high pass filter of FIG. 3 VOLTAGE SOURCE 15 (V15) drives OP-AMP 16 (A16) through RESISTOR 17 (R17). Feedback RESISTOR 18 (R18) realizes the equivalent inductor and the output is taken at node point 20. The equivalent inductor shown in the passive high pass prototype is given as:

$$L19 = \frac{R18}{\omega_t} = \frac{R18}{2\pi f_t} \quad \text{[Equation (3)]}$$

For the values cited in FIG. 3 the cut-off frequency is given by:

$$f_c = \frac{R17}{2\pi L19} = \frac{R17 f_t}{R18} = \frac{(1\text{ k})(1\text{ MHz})}{1\text{ M}} = 1\text{ kHz} \quad \text{[Equation (4)]}$$

where the nominal value of the op-amp A16's gain-bandwidth is taken as 1 MHz. This value is for the LM741 op-amp shown selected for the audio range.

Figure 4:
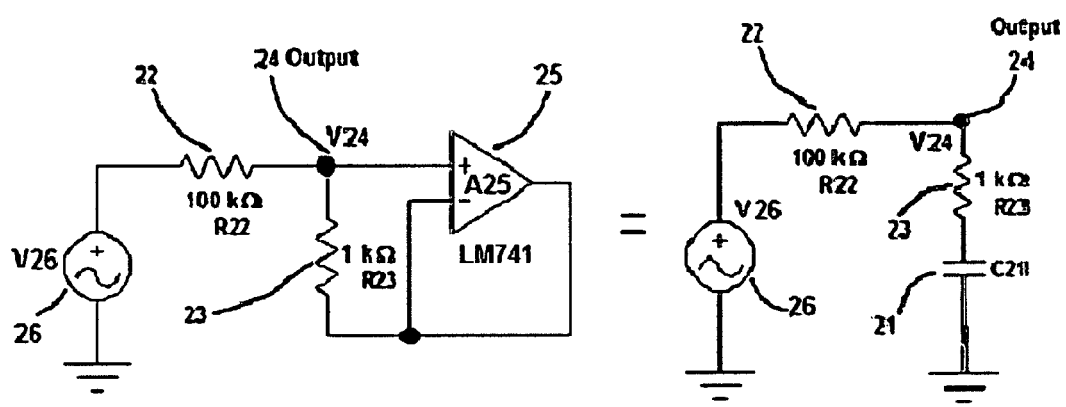
FIG. 4 Illustrates equivalence between op-amp with associated resistors and a passive low pass prototype.

FIG. 4 shows the equivalence between the OP-R and passive low pass prototype filter. Here VOLTAGE SOURCE 26 (V26) drives OP-AMP 25 (A25) through RESISTOR 22

(R22). RESISTOR 23 (R23) realizes the equivalent CAPACITOR 21 (C21) defined as:

$$C21 = \frac{1}{R23\omega_t} \quad \text{[Equation (5)]}$$

The output is taken at node point 24. For the values cited, the cut-off frequency is given by:

$$f_c = \frac{1}{2\pi R22 C21} \quad \text{[Equation (6)]}$$
$$= \frac{R23 f_t}{R22} = \frac{(1\ k)(1\ MHz)}{100\ k} = 10\ kHz$$

where again the nominal gain-bandwidth of A25 is taken for the LM741 op-amp as 1 MHz.

Figure 5:
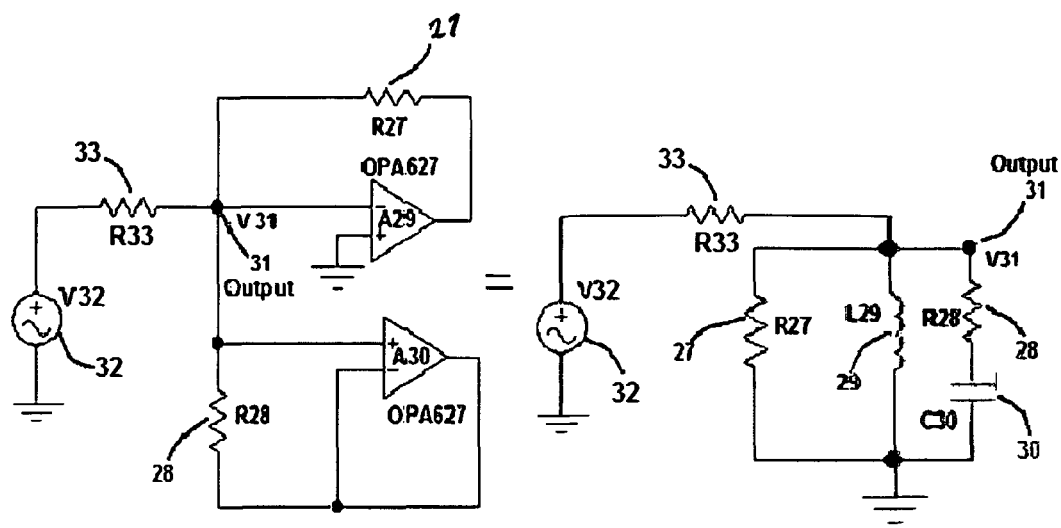
FIG. 5 Illustrates equivalence between op-amp with associated resistors and a passive band pass prototype.

Next we turn our attention to the band pass filter. FIG. 5 shows the OP-R and passive band pass prototype filter equivalence. This circuit combines the Op-R's inductor and capacitor in parallel. Both contain lossy resistance elements as previously demonstrated in FIG. 1 and FIG. 2. Their parallel combination in series with a RESISTOR 26 (R26) forms a 0.8 MHz band pass at 1.6 MHz center frequency. In this case the band pass is in the video range as contrasted to the previous low and high pass filters in the audio range. The reason for the higher frequency performance is the choice of Op-Amps 29 and 30 (A29 and A30), namely the OPA627. The OPA627's gain-bandwidth is 16 MHz as compared to 1 MHz for the LM741 in the previous case. As the equivalent inductor/capacitor elements show a higher $\Omega_t$ indicates lower equivalent inductor and capacitor values, thereby yielding a higher cut-off frequency filter. The design equations follow from the passive prototype filter as:

$$f_o = \frac{1}{2\pi\sqrt{L29 C30}} = f_t\sqrt{\frac{R28}{R27}} \quad \text{[Equation (7)]}$$

$$BW = \frac{f_o}{Q} = \frac{f_o\sqrt{L29/C30}}{R_{EQ}} \quad \text{[Equation (8)]}$$
$$= \frac{f_t\sqrt{\frac{R28}{R27}}\sqrt{R27 R28}}{R_{EQ}} = \frac{f_t R28}{R_{EQ}}$$

$$R_{EQ} = R33(1 + Q_c^2)\ //\ R27\ //\ R26; \quad \text{[Equation (9)]}$$

where // means "in parallel with"

$$Q_c = \frac{X_c}{R} = \frac{1}{2\pi f_o C30 R28} = \frac{f_t}{f_o} \quad \text{[Equation (10)]}$$

where equations (7), (8), (9), and (10) represent the center frequency, circuit 3 dB bandwidth, equivalent parallel resistance, and quality factor, respectively.

Using the following numerical values:
R26=14 kΩ R27=40 kΩ R28=400Ω $f_t$=16 MHz (OPA627)
Equations (7), (8), (9), and (10) are computed to be:

$$f_o = 16\ M\sqrt{\frac{0.4\ k}{40\ k}} = 1.6\ MHz$$

$$Q_c = \frac{16}{1.6} = 10$$

$$R_{EQ} = 0.4\ k(1 + 10^2)\ //\ 40\ k\ //\ 14\ k = 8.25\ k\Omega$$

$$BW = \frac{16\ M(0.4\ k)}{8.25\ k} = 0.78\ MHz$$

Floating Impedances

Figure 6:
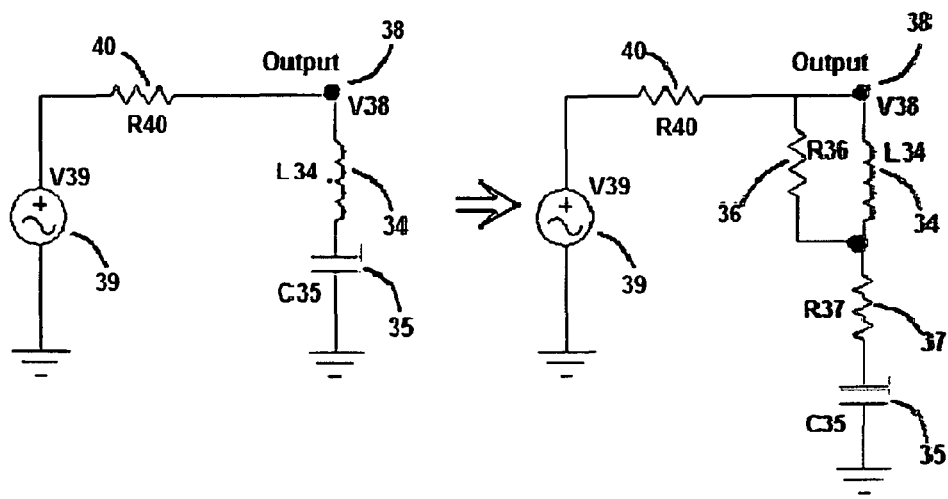
FIG. 6 Illustrates equivalence between a classic passive band reject filter and a passive lossy prototype.
Figure 7:
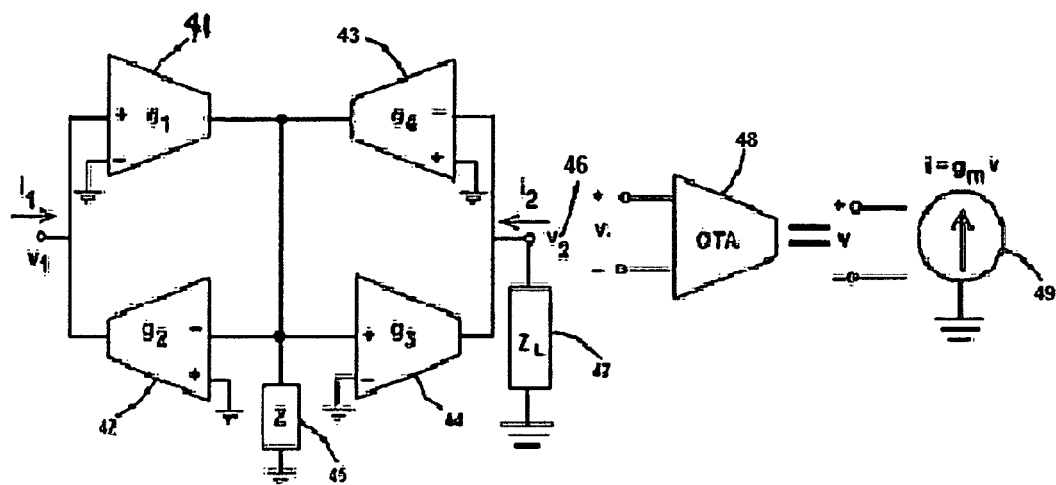
FIG. 7 Illustrates a circuit model in a quad operational transimpedance amplifier (OTA) configuration that realizes a floating impedance inverter.

In order to realize a broader class of filters, one being band reject, it will be necessary to employ floating impedances. FIG. 6 shows an example of a passive band reject prototype filter and its lossy counterpart. The lossy counterpart anticipates the resistances naturally occurring in OP-R equivalent circuits. In both circuits the inductor L34 is a floating impedance element. The lossy band reject circuit is then realized by a floating impedance inverter (FII), which in turn is realized with a floating OP-R circuit block. The technique to be employed in realizing floating impedance is to use OTAs (Operational Transconductance Amplifiers). FIG. 7 shows an FII circuit model in a quad OTA configuration that realizes a scaled floating admittance Y=$g^2$Z, where Z is grounded impedance 45. Elements 41, 42, 43 and 44 represent a plurality of OTAs where g is the transconductance of any OTA, all assumed to equal in value. A single OTA block 48 is defined as ideal transconductance controlled source 49, shown at the right of the FII circuit block in FIG. 7. The OTA is chosen over a MOSFET to realize a single transconductance source because it requires less circuitry to bias. The FII output is taken at node 46.

* IEEE Trans. On Circuits & Systems, Theory & Applications, Vol. 43, No. 6, June 1996.

Figure 8:
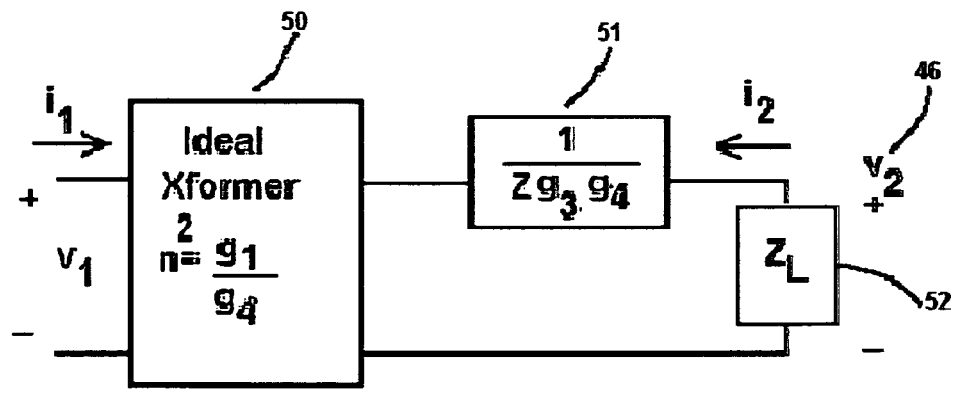
FIG. 8 Illustrates an equivalent passive equivalent circuit model of FIG. 7 with ideal transformer.
Figure 9:
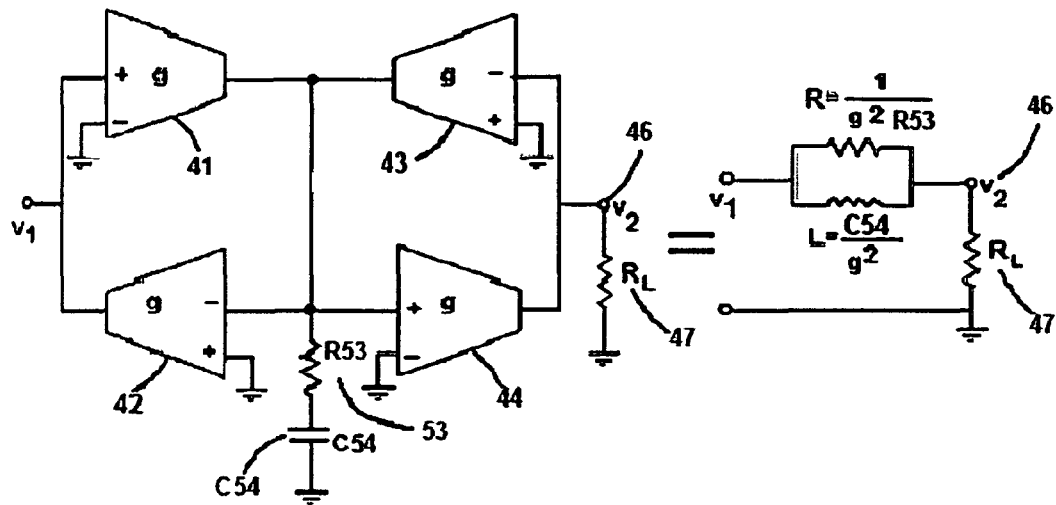
FIG. 9 Illustrates how a series RC grounded impedance is transformed into a floating lossy inductor to form a floating lossy inductor.
Figure 10:
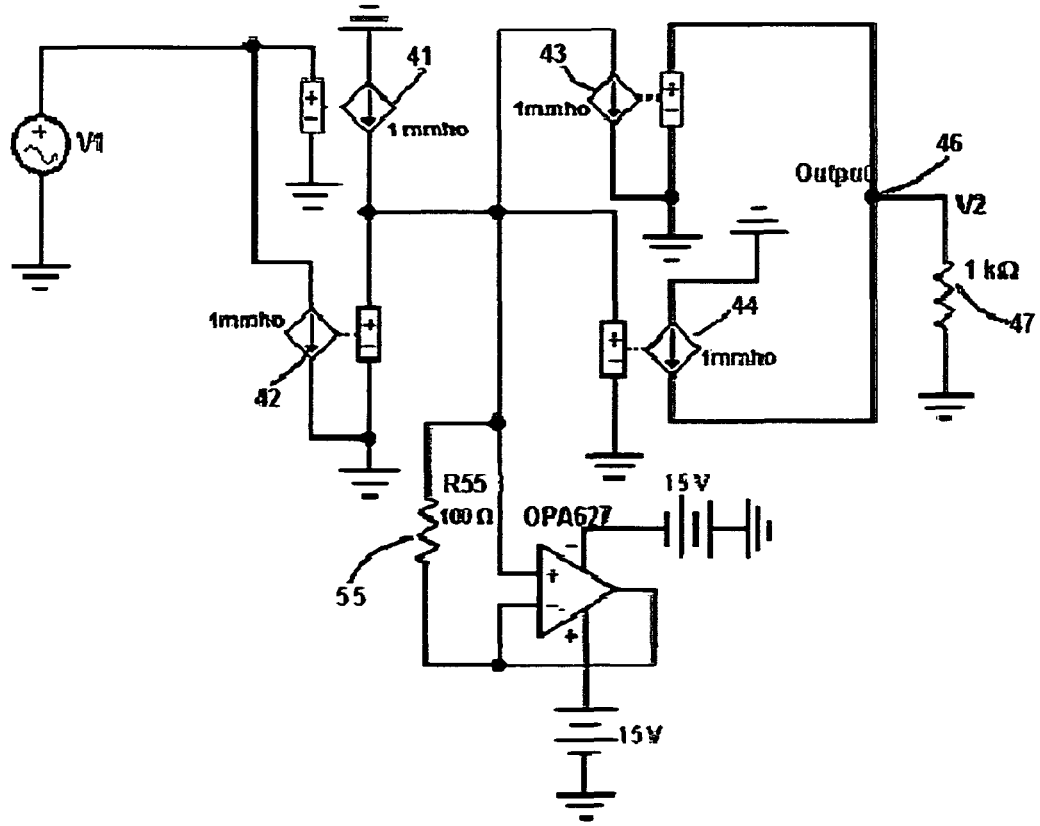
FIG. 10 Illustrates the model of FIG. 9 as an OP-R circuit composed of only OTAs and resistors.

FIG. 8 shows an equivalent passive equivalent circuit model of FIG. 7. For convenience, where the OTA transconductances are assumed to be equal, i.e., g1=g2=g3=g4=g. For example, the FII of FIG. 8 then transforms the series R53-C54 grounded impedance in the left part of FIG. 9 into a floating lossy inductor in the equivalent circuit at the right part of FIG. 9. This can be termed an FII conversion or transform. The ideal transformer 50 in FIG. 8 vanishes under the assumption that g1=g4=g. Furthermore, the series impedance 51 simplifies to $(Zg^2)^{-1}$ under the assumption that g3=g4=g. Next the OP-R realization for the series R53-C54 results in the complete IC circuit of FIG. 10.

We are now in a position to realize the lossy floating inductor L34 in the band reject filter of FIG. 6 employing the same FII technique. In addition, the grounded lossy capacitor comprised of C35 and R37 of FIG. 6 are realized as previously derived in FIG. 2. Combining designs for both floating and grounded elements results in the complete IC of FIG. 11.

Simulations run for all of the filter types demonstrated complete and accurate agreement with theory, thereby establishing the OP-R technique as a viable and useful technique in filter design.

Tunability, Tolerance, and Temperature

Filter design would be incomplete without an adjustment procedure often referred to as tunability. Tunability is required because of component tolerances, also known as production spread, and temperature variations.

The main parameter in OP-R design that affects tunability is the op-amp's gain-bandwidth parameter, $f_t$. It is well known that for an op-amp that the gain-bandwidth is linearly related to transconductance $g_m$ and junction capacitance $C_j$ by:

$$f_t = \frac{g_m}{2\pi C_j}; \quad g_m = \frac{I_c}{\phi_T}; \quad \phi_T = \frac{kT}{q} \quad \text{[Equation (11)]}$$

where $I_c$ is the collector current of an intermediate Miller stage, $\phi_T$ is the so-called thermal voltage, k is Boltzman's constant, q is the charge on an electron, and T is absolute temperature in degrees Kelvin. It is easy to see that adjustment of the collector current will afford control of $f_t$, if necessary. This is performed with a current mirror CM. The operation of a current mirror is as follows**:

** A Short Discussion of the Operational Transconductance Amplifier (OTA), Eugene M. Zumchak, URL: http://www.emusic-diy.org/References/OTA, February 1999.

Figure 12:
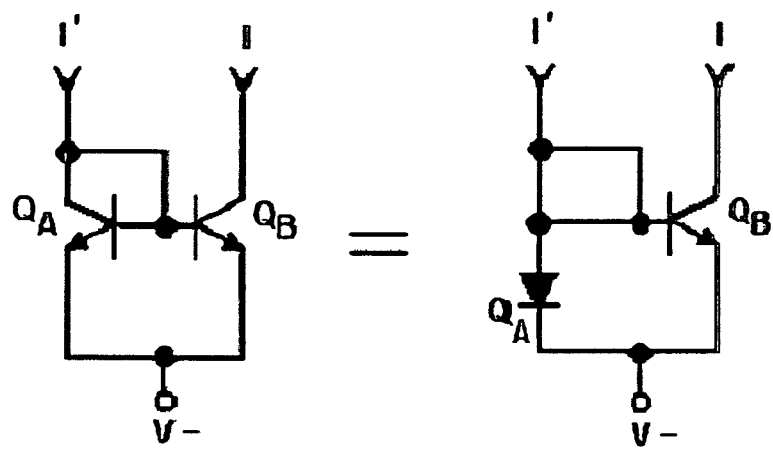
FIG. 12 Illustrates a simple current mirror and an alternate form with a diode.

FIG. 12 shows a simple current mirror, and an alternate form with a diode. An external resistor $R_e$ is connected between the positive rail, say +12 volts, and the collector of $Q_A$. Since the collector of $Q_A$ is connected to its base there is just a diode drop from collector to emitter. Let us assume that this diode drop is 0.6 volts. Thus, if $V_-$ is at ground potential the voltage across resistor $R_e$ is 11.4 volts. Otherwise, if it is at the negative rail, say $-12$ volts, then the voltage across resistor $R_e$ is 23.4 volts. In either case value of resistor can selected the to fix the current I'. I' is the sum of the base current and the collector current (beta times the base) of $Q_A$, where the base current is defined by resistor $R_e$. Since transistors $Q_A$ and $Q_B$ are monolithic and matched, and their base-emitter junctions are in parallel, whatever collector current flows in $Q_A$ defines the same collector current I in $Q_B$. We say that I is a mirror of I'. Also, since transistor $Q_A$ acts like a diode, it is typically shown as a diode, as in the right side of FIG. 12. For our case, current I is the current that establishes $g_m$ and hence the gain-bandwidth $f_t$. Thus, the external resistor $R_e$ tunes $f_t$ and hence the equivalent OP-R's L and C components. Furthermore, since the product of L and C yields a filter's critical frequency $f_n$ or $f_c$, while the ratio of L and C yield stage Q, external resistor $R_e$ tunes the filter's critical frequency while not affecting its Q factors or frequency response shape.

Figure 11:
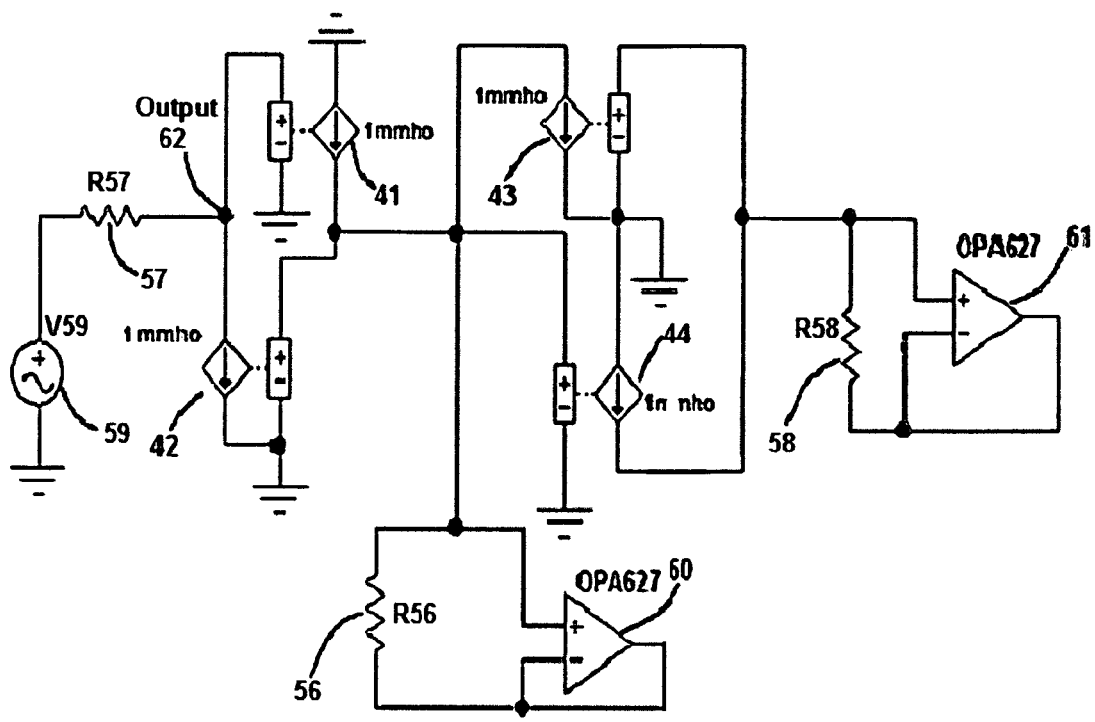
FIG. 11 Illustrates an OP-R circuit of a lossy band reject filter composed of only OTAs and resistors.

Temperature acts to vary $f_t$ by the same mechanism that enables tunability, and thus will misadjust the filter's critical frequencies. Since $\phi_T$ varies directly with temperature T it is necessary to increase collector current $I_c$ to keep $f_t$ constant, as can be seen by equation (11). One way of increasing $I_c$ with temperature is use the fact that the base-emitter voltage of a transistor, such as $Q_A$ or a silicon Zener diode, has a negative temperature coefficient (TC) of $-2.2$ mvolts/° C. So if we insert a Zener diode in series with the external resistor $R_e$ the potential difference across $R_e$ increases with temperature 4.4 mvolts/° C. The current I' (see FIG. 11) increases by 0.0044/$R_e$ amps/° C. By current mirror action collector current I also increases with temperature thereby tracking the thermal voltage $\phi_T$. For example, it is well known that the temperature coefficient (T.C.) of an op-amp's $f_t$ is $-0.0033/$.degree. C. To offset this variation with current tracking assume that a 5.6 volt Zener in series with external resistor $R_e$ is connected between the positive 12-volt rail and a grounded negative rail yielding a base current of:

$$I' = (12 - 0.6 - 5.6)/R_e = 5.8/R_e \text{(amps)} \quad \text{[Equation (12)]}$$

which is equivalent to collector current I by current mirror action, as shown in FIG. 11. Thus, the fractional change in collector current is:

$$\Delta I/I = [0.0044/R_e/° C.]/5.8/R_e = 0.0008/° C., \quad \text{[Equation (13)]}$$

which is too small to track the $f_t$ variation of $-0.0033/°$ C. completely. By the same analysis the choice of larger Zener breakdown of 10.07 volts completely tracks the $f_t$ variation.

Finally, it should be said that since OP-R filters enjoy the same minimum sensitivity due to parameter variation as their passive counterpart filters, excellent filter performance should be expected with regard to production spread. Even then $f_t$ trimming may still be required on a per stage basis for proper alignment. In addition to sensitivity, noise is also a prime consideration in filter design. Here careful arrangement of filter section order minimizes output noise. For example, placing the lowest Q stage closest to the output optimally reduces output noise. Of course, component noise in passive filters is still superior, owing to the absence of active elements present in the active filter class, of which OP-R filters belong.

What is claimed is:

1. A filter comprising:
    a voltage source having a first connection point coupled to ground;
    a first resistor having a first end directly coupled to a second connection point of said voltage source;
    an operational amplifier having a non-inverting input, an inverting input and an output, said non-inverting input directly coupled to the second end of said first resistor;
    a second resistor having a first end directly connected to the non-inverting input of said operational amplifier and the second end of said first resistor;
    said second resistor having a second end directly connected to an inverting input of said operational amplifier;
    said operational amplifier having an output directly coupled to the second end of said second resistor and to the inverting input of said operational amplifier.

2. The filter according to claim 1 wherein an equivalent capacitor is calculated by the following formula:

$$C21 = \frac{1}{R23\omega_t}$$

wherein C21 is an equivalent capacitor and R23 is said second resistor.

3. The filter according to claim 2 wherein a cut-off frequency is given by the following formula:

$$f_c = \frac{1}{2\pi R22 C21}$$

wherein $f_c$ is a cut-off frequency, C21 is the equivalent capacitor and R22 is said first resistor.

4. The filter according to claim 1 wherein said filter is integrated onto a single substrate.

5. The filter according to claim 1 wherein said filter is tuned for a selected frequency response.

6. The filter according to claim 1 wherein said filter automatically provides thermal compensation to offset effects of temperature change on the filter.

* * * * *